(12) United States Patent
Goldbach et al.

(10) Patent No.: US 10,672,749 B2
(45) Date of Patent: Jun. 2, 2020

(54) LIGHT SOURCE COMPRISING A NUMBER OF SEMI-CONDUCTOR COMPONENTS

(71) Applicant: OSRAM OLED GmbH, Regensburg (DE)

(72) Inventors: Matthias Goldbach, Pentling (DE); Juergen Holz, Wenzenbach (DE); Stefan Illek, Donaustauf (DE); Stefan Groetsch, Bad Abbach (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/574,926

(22) PCT Filed: May 17, 2016

(86) PCT No.: PCT/EP2016/061020
§ 371 (c)(1),
(2) Date: Nov. 17, 2017

(87) PCT Pub. No.: WO2016/184854
PCT Pub. Date: Nov. 24, 2016

(65) Prior Publication Data
US 2018/0166428 A1    Jun. 14, 2018

(30) Foreign Application Priority Data
May 18, 2015   (DE) ........................ 10 2015 107 739

(51) Int. Cl.
*H01L 25/16*   (2006.01)
*H01L 25/075*  (2006.01)
(Continued)

(52) U.S. Cl.
CPC ............ *H01L 25/167* (2013.01); *H01L 24/48* (2013.01); *H01L 24/49* (2013.01);
(Continued)

(58) Field of Classification Search
CPC ....... H01L 25/167; H01L 24/48; H01L 24/49; H01L 25/0753; H01L 33/62;
(Continued)

(56) References Cited

U.S. PATENT DOCUMENTS

| 8,780,023 B2 | 7/2014 | Ooroii | |
|---|---|---|---|
| 2001/0022564 A1* | 9/2001 | Youngquist | ............... G09F 9/33 345/55 |

(Continued)

FOREIGN PATENT DOCUMENTS

| CN | 101345236 A | 1/2019 |
|---|---|---|
| DE | 20 2010 008 460 U1 | 3/2011 |

(Continued)

OTHER PUBLICATIONS

Notice of Reasons for Rejection dated Dec. 4, 2018, of counterpart Japanese Application No. 2017-558993, in English.
(Continued)

*Primary Examiner* — Fernando L Toledo
*Assistant Examiner* — Neil R Prasad
(74) *Attorney, Agent, or Firm* — DLA Piper LLP (US)

(57) ABSTRACT

A light source includes a plurality of semiconductor components, wherein a semiconductor component includes a plurality of light-emitting diodes, the diodes are arranged in a predefined grid in at least one column in or on the semiconductor component, and a control circuit that drives the individual diodes is arranged on the semiconductor component.

10 Claims, 15 Drawing Sheets

(51) Int. Cl.
    *H01L 23/00*     (2006.01)
    *H01L 33/62*     (2010.01)

(52) U.S. Cl.
    CPC .......... *H01L 25/0753* (2013.01); *H01L 33/62* (2013.01); *H01L 2224/48137* (2013.01); *H01L 2224/49171* (2013.01); *H01L 2924/12041* (2013.01); *H01L 2924/1426* (2013.01)

(58) Field of Classification Search
    CPC . H01L 2224/48137; H01L 2224/49171; H01L 2924/12041; H01L 2924/1426
    See application file for complete search history.

(56) References Cited

U.S. PATENT DOCUMENTS

| | | |
|---|---|---|
| 2003/0025657 A1 | 2/2003 | Iwafuchi |
| 2003/0026096 A1 | 2/2003 | Ellens et al. |
| 2009/0160826 A1* | 6/2009 | Miller .................. G09G 3/3291 345/204 |
| 2010/0141175 A1* | 6/2010 | Hasnain ................ H01L 27/153 315/294 |
| 2012/0113038 A1* | 5/2012 | Chen .................... G06F 3/0412 345/173 |
| 2012/0119980 A1 | 5/2012 | Joffer et al. |
| 2012/0256814 A1 | 10/2012 | Ootorii |
| 2014/0231668 A1* | 8/2014 | Yasuda .................. B82Y 40/00 250/396 R |
| 2014/0267683 A1* | 9/2014 | Bibl ....................... H01L 51/50 348/87 |
| 2016/0076731 A1 | 3/2016 | Mönch et al. |

FOREIGN PATENT DOCUMENTS

| | | |
|---|---|---|
| DE | 10 2012 217 932 A1 | 4/2014 |
| DE | 10 2013 104 046 A1 | 10/2014 |
| EP | 1 282 171 A2 | 2/2003 |
| JP | 2003-308028 A | 10/2003 |
| JP | 2008-172177 A | 7/2008 |
| JP | 2009-016093 A | 1/2009 |
| JP | 2009-038302 A | 2/2009 |
| JP | 2012-204020 A | 10/2012 |
| JP | 2012-227514 A | 11/2012 |
| JP | 2014-003279 A | 1/2014 |
| WO | 2010/108751 A1 | 9/2010 |
| WO | 2014/024082 A2 | 2/2014 |
| WO | 2014/173736 A1 | 10/2014 |

OTHER PUBLICATIONS

First Office Action dated Sep. 27, 2019, of counterpart Chinese Application No. 201680042301.8, along with an English translation.

German Search Report dated Jan. 15, 2016 of corresponding German Application No. 10 2015 107 739.6.

\* cited by examiner

LIGHT SOURCE COMPRISING A NUMBER OF SEMI-CONDUCTOR COMPONENTS

TECHNICAL FIELD

This disclosure relates to a light source comprising a plurality of light emitting semiconductor components and a light emitting semiconductor component.

BACKGROUND

DE 10 2013 104 046 A1 discloses an optical arrangement and a display device. The optical arrangement comprises a multiplicity of light emitting chips on a carrier. First light emitting chips each comprise pixels of a first group and second light emitting chips each comprise pixels of a second group. Respectively, one of the first and one of the second light emitting chips are arranged in first unit cells in a planar manner on the carrier. Furthermore, an optical element is provided. It is disposed downstream of the light emitting chips in the emission direction. The optical element is configured to guide light emitted by the pixels of the first and second groups such that light of the first pixels of the first group and light of the second pixels of the second group is redistributed in second unit cells in a coupling-out plane such that the second unit cells each comprise an area smaller than the area of each one of the first unit cells. In this case, each pixel in the coupling-out plane is individually addressable by activation of the corresponding pixel of the light emitting chips.

There is nonetheless a need to provide a simplified electronic driving of a light source with individually drivable light points consisting of a plurality of light emitting semiconductor components, and an improved light emitting semiconductor component.

SUMMARY

We provide a light source including a plurality of semiconductor components, wherein a semiconductor component includes a plurality of light-emitting diodes, the diodes are arranged in a predefined grid in at least one column in or on the semiconductor component, and a control circuit that drives the individual diodes is arranged on the semiconductor component.

We also provide a semiconductor component including a plurality of light emitting diodes, wherein the diodes are arranged in a predefined grid in at least one column on the semiconductor component, a control circuit that drives the individual diodes is arranged on the semiconductor component, and the control circuit is configured to drive the diodes individually.

LIST OF REFERENCE SIGNS

Figure 1:
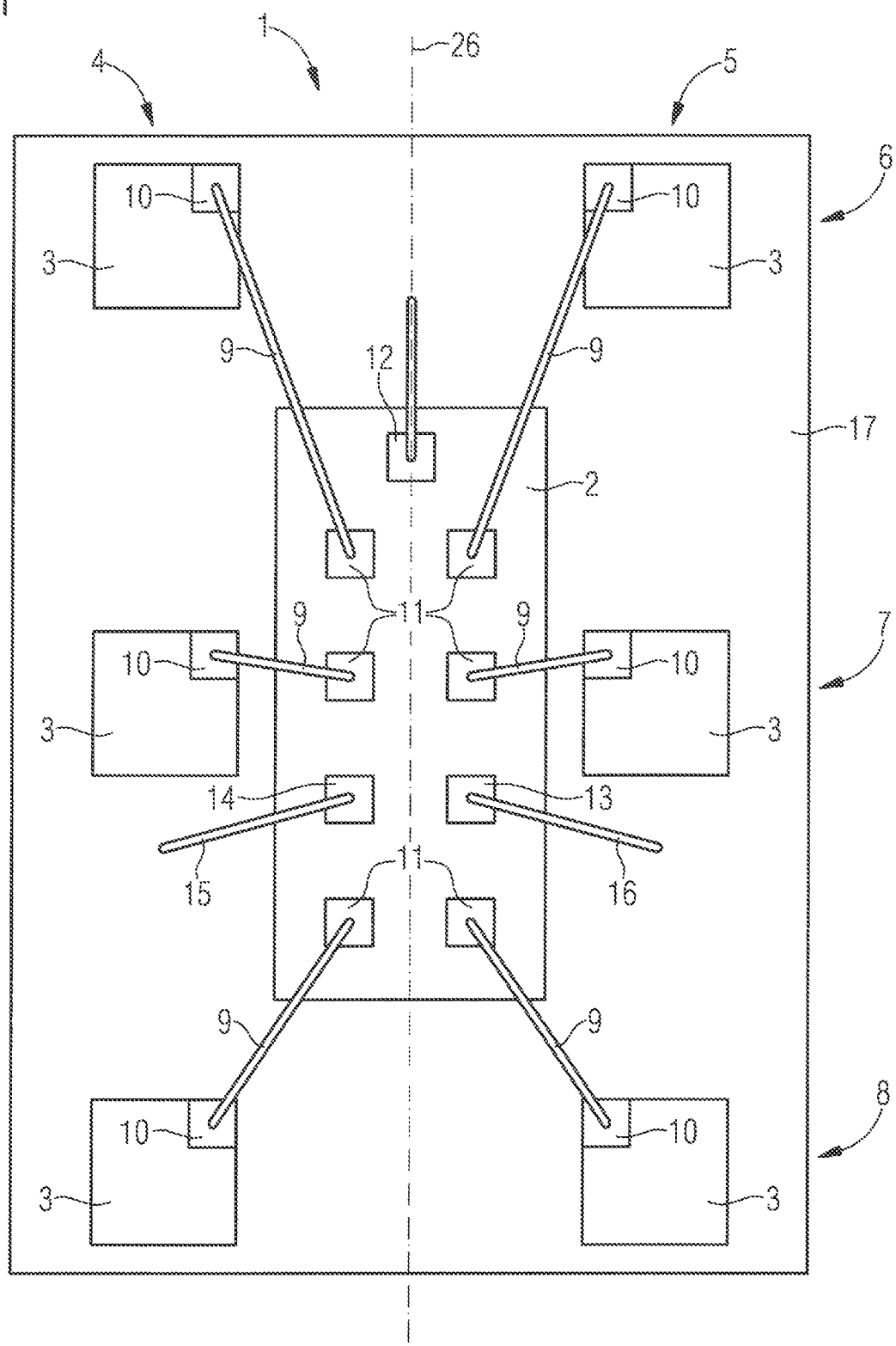
FIG. 1 shows a schematic plan view of a first example of a hybrid component comprising a plurality of semiconductor components.

1 Light emitting semiconductor component
2 Control circuit
3 Diode
4 First column
5 Second column
6 First row
7 Second row
8 Third row
9 Electrical line
10 First contact
11 First contact pad
12 Second contact pad
13 Third contact pad
14 Fourth contact pad
15 First control line
16 Second control line
17 Carrier
18 Rear side
19 First electrically conductive area
20 Second electrically conductive area
21 Third electrically conductive area
22 Fourth electrically conductive area
23 Isolation region
24 Carrier surface
26 Center axis
27 Light source
28 Second control circuit
29 Optical element
30 Redistributed pixel
31 Light area
32 Microlenses
33 Prism array
34 Further prism array
35 Further microlens array
36 First contact track
37 Second contact track
38 First array
39 First array 40 Third column
41 Third contact track
42 First electrical contact
43 Second electrical contact
44 Third electrical contact
45 Fourth electrical contact
50 Carrier tape
51 Contact track

DETAILED DESCRIPTION

One advantage of our light source is that a light source comprising improved light properties in particular for pixel-by-pixel driving is provided in a cost-effective manner.

The diodes may be arranged in a predefined grid in columns on or in the semiconductor component such that adjacent diodes comprise the same spacing, wherein a plurality of semiconductor components are arranged such that the diodes of adjacent semiconductor components comprise the same spacing as adjacent diodes of a semiconductor component. As a result, homogeneity of the light beam of the light source is improved.

Each semiconductor component independently of the number of diodes may comprise only four electrical contacts, wherein a first contact is provided for ground, a second contact is provided for a voltage supply, a third contact is provided for a signal input and a fourth contact is provided for a signal output. This provides a simple structure of the semiconductor component that yields an electrical supply of the control circuit and the light emitting diodes.

The control circuits may be configured to obtain and process information in the form of a daisy-chain protocol. In this way, a multiplicity of semiconductor components may be supplied with control signals for the individual driving of the light emitting diodes by corresponding control circuits in a simple manner.

The control circuit may be arranged between two columns of diodes. A compact construction with at the same time uniform distribution of the diodes is made possible as a result.

The two columns of diodes may be arranged between the control circuit and a further control circuit. A compact arrangement of diodes and two control circuits on a semiconductor component is achieved in this way.

A semiconductor component may comprise two columns of diodes, wherein the two columns are arranged on opposite sides of the control circuit, and the two columns comprise at least two, in particular three or more diodes. By this means too a compact arrangement comprising a multiplicity of diodes is provided.

At least two columns of semiconductor components may be provided, wherein two adjacent semiconductor components of one column each comprise an identical spacing with respect to one another, wherein the semiconductor components of the second column are arranged laterally offset with respect to the semiconductor components of the first column, and in particular the semiconductor components of the second column are arranged midway between two semiconductor components of the first column. A uniform distribution of the light emitting diodes of the individual semiconductor components is achieved in this way.

At least one optical device may be provided to combine the beams of the individual diodes of the semiconductor components to form a continuous, uniform light area. An adaptive configuration of the light distribution of the light area may be realized by targeted driving of the individual diodes.

A plurality of diodes may be arranged in at least two columns and a plurality of rows, wherein the diodes of a row are arranged on a straight line, the diodes of a column are arranged on a straight line, the diodes are arranged in a grid comprising spacings of identical magnitude between adjacent diodes, a first contact track for a first diode of the first row and the first column is led laterally to the diode, and a second contact track of a second diode of the second column and the first row is led laterally between two rows of diodes to the second diode of the second column and the first row. A simple and space-saving arrangement of the contact tracks to the diodes is made possible in this way.

The diodes may be arranged in at least three columns and a plurality of rows, wherein a first contact track for a first diode of the first row and the first column is led laterally to the diode, the second contact track of the second diode of the second column and the first row is led laterally between two rows of diodes to the second diode of the second column and the first row, and a third contact track is led between two rows of diodes to the third diode of the third column and the first row.

A first array of diodes and a second array of diodes may be provided. The first and second arrays are arranged mirror-symmetrically with respect to a mirror axis. The corresponding contact tracks are led to the individual diodes in each case laterally from outside. A compact arrangement of the diodes and the contact tracks is made possible in this way.

The control circuits may be arranged symmetrically with respect to a center axis, wherein a first contact pad that feeds a signal and a second contact pad that passes on a signal are arranged mirror-symmetrical with respect to a center axis of the semiconductor component, and a third contact pad that supplies power of the at least one control circuit is arranged mirror-symmetrically with respect to the center axis. A compact construction of the semiconductor component that is simple to produce is provided in this way.

We also provide correspondingly configured semiconductor chips.

The above-described properties, features and advantages and the way in which they are achieved will become clearer and more clearly understood in association with the following description of the examples that are explained in greater detail in association with the drawings.

FIG. 1 shows, in a schematic illustration, a plan view of a semiconductor chip 1 comprising a control circuit 2 and six light emitting diodes 3. The semiconductor component 1 comprises a carrier 17 on which the diodes 3 and the control circuit 2 are applied or the diodes 3 and the control circuit 2 are integrated. Instead of a carrier, an arrangement in which the diodes 3 and the control circuit 2 are embedded in a plastics material and form the semiconductor component 1 may also be provided. The six diodes 3 are arranged such that in each case two adjacent diodes comprise a spacing of identical magnitude with respect to one another. The diodes 3 are arranged in two columns 4, 5 and three rows 6, 7, 8. The first and second columns 4, 5 have the same spacing as the rows 6, 7, 8 with respect to one another. The control circuit 2 is arranged centrally between the first and second columns 4, 5. The control circuit 2 connects to a first electrical contact 10 of each diode 3 in each case via an electrical line 9. To that end, the control circuit 2 comprises first contact pads 11. Furthermore, the control circuit 2 comprises a second contact pad 12, via which the control circuit connects to a supply voltage. Moreover, the control circuit 2 comprises a third and a fourth contact pad 13, 14.

The third contact pad 13 feeds a control signal. The fourth contact pad 14 passes on a control signal.

In the illustrated example of the control circuit 2, the individual contact pads 11 to 14 are arranged mirror-symmetrically with respect to a center axis 26. Moreover, in the illustrated example in FIG. 1, the diodes 3 are also arranged mirror-symmetrically with respect to the center axis 26 of the semiconductor component 1.

To feed the control signal, a first control line 15, and to pass on the control signal, a second control line 16 connect to the corresponding third and fourth contact pads 13, 14, respectively.

The control circuit 2 is configured, for example, to obtain, process and correspondingly pass on control signals in accordance with a daisy-chain protocol. Furthermore, the control circuit 2 is configured to drive the individual diodes 3 individually and independently of one another.

Figure 2:
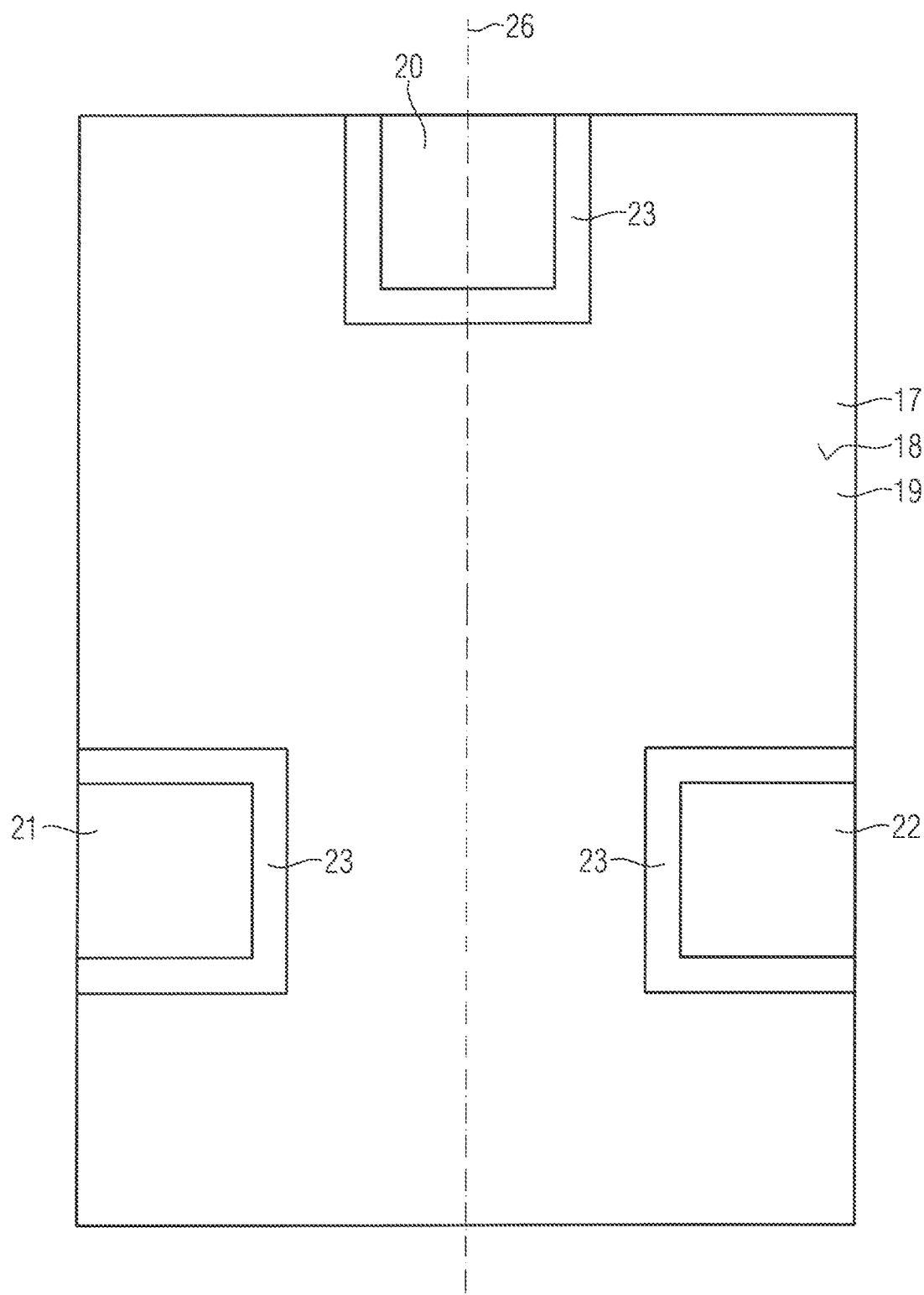
FIG. 2 shows a view from below of the arrangement from FIG. 1.

FIG. 2 shows a rear side 18 of the semiconductor component 1 in a schematic illustration.

A first electrically conductive area 19 constituting an electrical terminal for a ground potential, is provided on the rear side 18 of the carrier 17. Furthermore, the rear side 18 comprises a second electrically conductive area 20 that may connect to a supply voltage. Moreover, a third electrically conductive area 21 that feeds a control signal is provided. Furthermore, a fourth electrically conductive area 22 that outputs and forwards the control signal is provided. The electrically conductive areas 19, 20, 21, 22 are electrically insulated from one another via corresponding insulation regions 23.

Furthermore, in FIG. 2, both the second electrically conductive area 20 and also the third and fourth electrically conductive areas 21, 22 are arranged mirror-symmetrically with respect to the center axis 26.

Since only four external electrical contacts are required for the semiconductor component 1, a simple layout is sufficient for the configuration of the semiconductor component 1. Moreover, good heat dissipation may be achieved on account of the symmetrical arrangement of the diodes.

Figure 3:
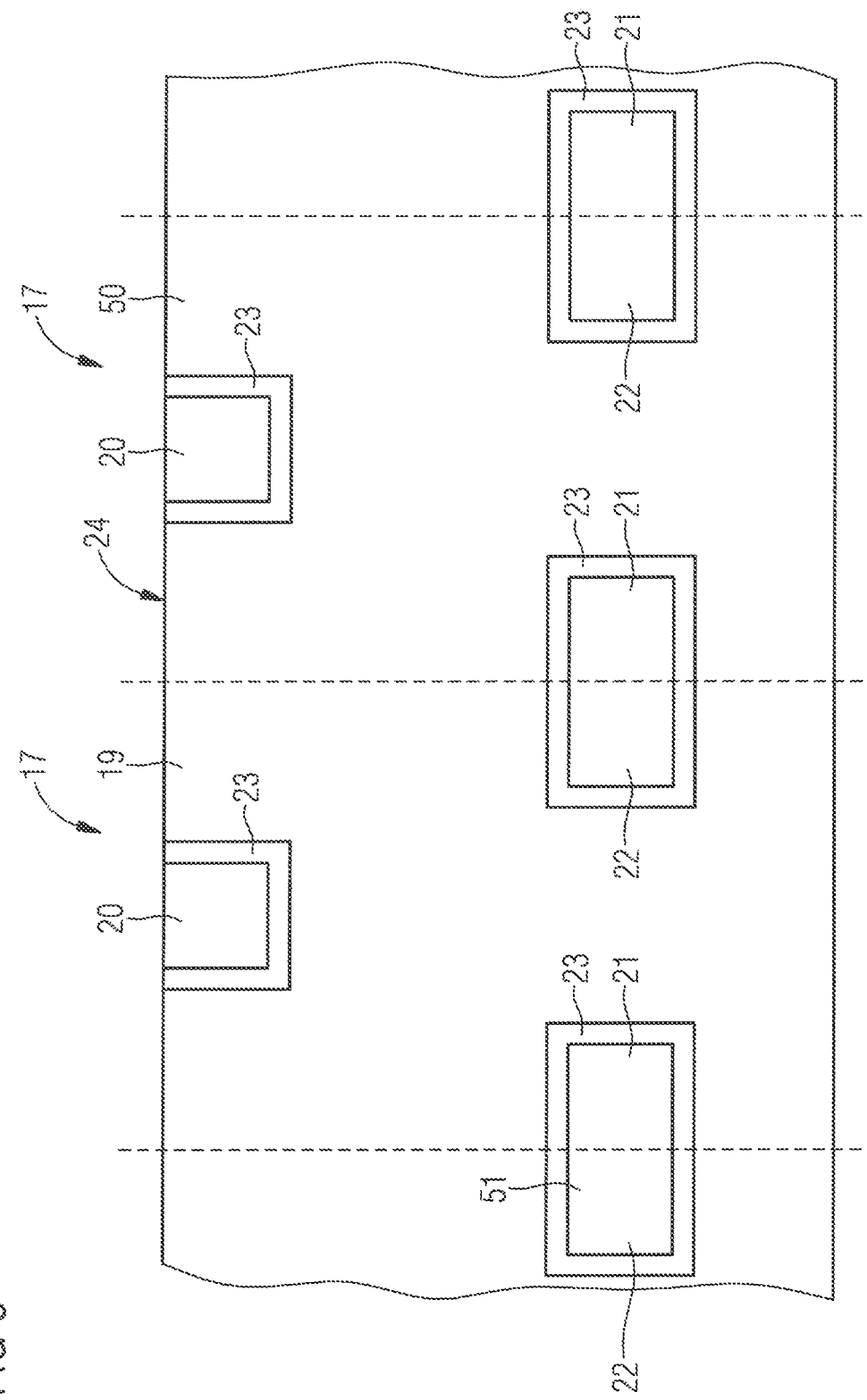
FIG. 3 shows a schematic illustration of an excerpt from a rear side of a component assemblage comprising a carrier wafer.

FIG. 3 shows a carrier tape 50 comprising a carrier surface 24 in a schematic illustration. The carrier surface 24 may be divided into individual carriers 17 by corresponding singulation. The individual carriers 17 are illustrated in a manner separated from one another in the form of a dashed line in FIG. 3.

On the basis of this configuration, a simple layout may be used to form a plurality of carriers 17 comprising corresponding carrier units in accordance with FIG. 2 from a continuous carrier surface 24. In this case, a contact track 51 may be divided by a corresponding separation into a third electrically conductive area 21 and a fourth electrically conductive area 22.

Figure 4:
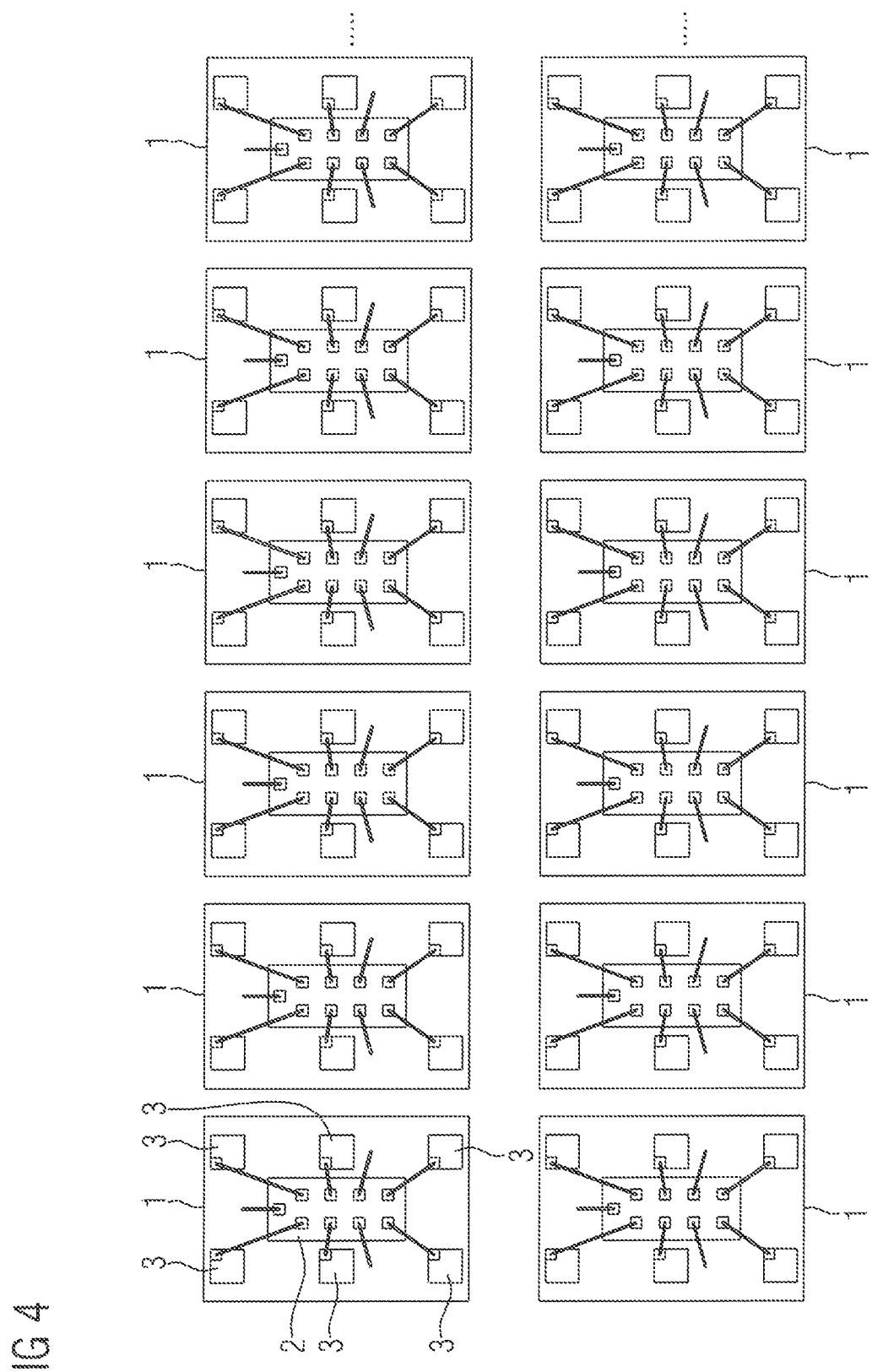
FIG. 4 shows a light source comprising a plurality of semiconductor components in accordance with FIG. 1.

FIG. 4 shows a schematic illustration of a light source 27, wherein eight semiconductor components 1 in accordance with the example in FIG. 1 are arranged in two columns. In the example shown, a semiconductor component comprises in each case three light emitting diodes 3 in a column. Moreover, the diodes 3 of the two columns are arranged in each case in three rows on a semiconductor component 1. Consequently, in the example illustrated, adjacent diodes of all the rows of a semiconductor component 1 comprise the same spacing with respect to one another. Likewise adjacent diodes of all the columns of a semiconductor component 1 comprise in each case the same spacing. The spacings between the diodes of a row and the diodes of a column of a semiconductor component 1 may be of identical magnitude, as in the example shown, even though a control circuit 2 is arranged between the diodes 3. Depending on the example chosen, the spacings of adjacent diodes along a row may be of a different magnitude compared to the spacings of the diodes along a column.

The semiconductor components 1 may be configured identically. Moreover, in the example illustrated, the semiconductor components 1 are arranged such that the spacings of adjacent diodes 3 of two different adjacent semiconductor components 1 along a row are of exactly the same magnitude as the spacings of the diodes 3 along a row on a semiconductor component 1. Furthermore, in the example illustrated, the semiconductor components 1 are arranged such that the spacings of adjacent diodes 3 of two different adjacent semiconductor components 1 along a column are of exactly the same magnitude as the spacings of the diodes along a column on a semiconductor component.

The spacings of adjacent diodes 3 of two adjacent semiconductor components 1 along a row may be of identical magnitude or different magnitude with respect to the spacings of adjacent diodes of a column of two adjacent semiconductor components. Moreover, the semiconductor components may also comprise more or fewer than two columns of diodes 3. Furthermore, the semiconductor components may also comprise more or fewer than three rows of diodes 3. Moreover, the semiconductor components 1 may also comprise more than one control circuit. Even in these different examples, the semiconductor components 1 may be arranged or configured such that the diodes 3 of adjacent semiconductor components 1 comprise the same spacing along a row as the diodes 3 arranged on a semiconductor component. Moreover, even in these different examples, the semiconductor components 1 may be arranged or configured such that the diodes 3 of adjacent semiconductor components 1 comprise the same spacing along a column as the diodes 3 arranged on a semiconductor component 1. A uniform distribution of the diodes in the light source is achieved in this way.

More or fewer semiconductor components 1 may also be arranged, depending on the example chosen. Moreover, the semiconductor components 1 may also be arranged in a different arrangement comprising a plurality of columns and/or rows. For the realization of a light source 27 comprising 300 pixels, fifty semiconductor components 1 may be provided, wherein respectively two columns comprising respectively twenty-five semiconductor components 1 are arranged. Optical elements that homogenize and/or uniformly distribute the light radiation of the diodes 3 of the light source 27 may be provided, depending on the example chosen.

Figure 5:
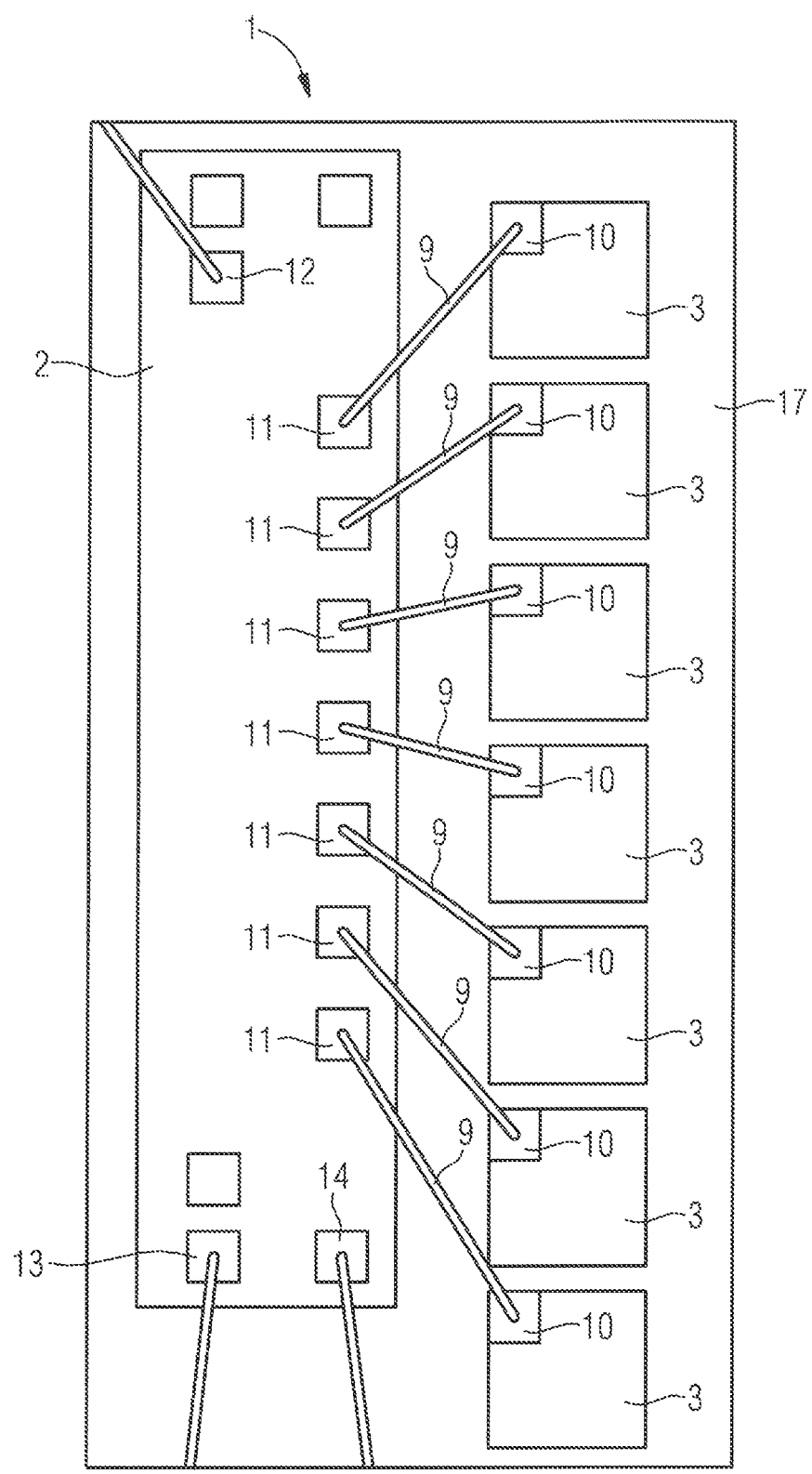
FIG. 5 shows a schematic plan view of a further example of a semiconductor component.

FIG. 5 shows a further example of a semiconductor component 1, wherein the semiconductor component 1 comprises a carrier 17 on which a control circuit 2 and seven diodes 3 are arranged. The control circuit 2 comprises first contact pads 11 connected to a first contact 10 of a diode 3 in each case via an electrical line 9. Moreover, the control circuit 2 comprises a second contact pad 12 that feeds the supply voltage. Furthermore, the control circuit 2 comprises a third and a fourth contact pad 13, 14. The third contact pad 13 feeds a control signal. The fourth contact pad 14 passes on the control signal.

In the example illustrated, the diodes 3 are arranged in a column with identical spacings with respect to one another. The control circuit 2 is arranged alongside the column of the diodes 3 on the carrier 17 and with a longitudinal axis parallel to the axis of the column of the diodes 3.

Figure 6:
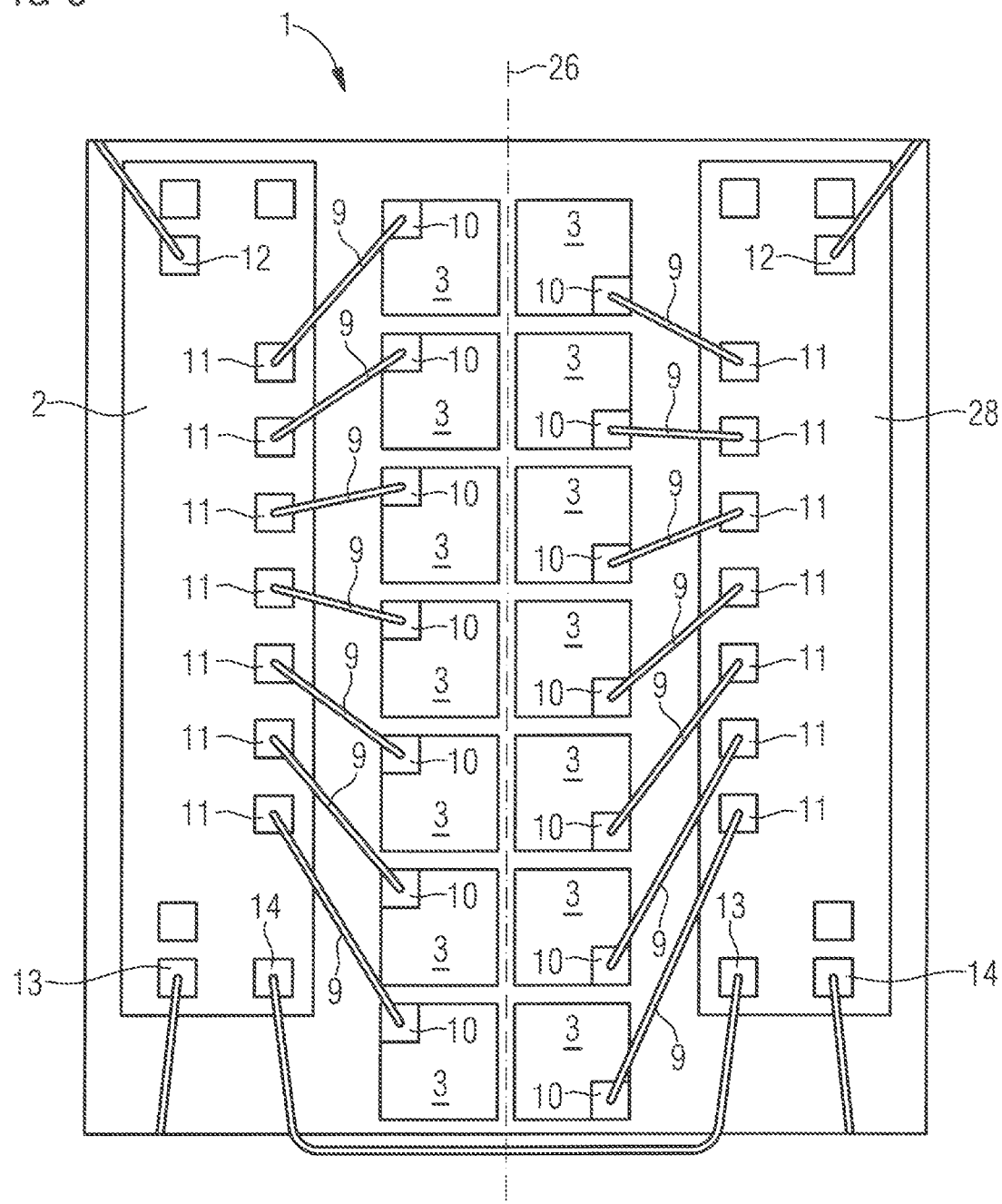
FIG. 6 shows a plan view of a further example of a semiconductor component.

FIG. 6 shows a further example of a semiconductor component 1, wherein the arrangement is configured in accordance with FIG. 5, but comprises a second column of diodes 3 and a second control circuit 28. The second column of diodes 3 is arranged mirror-symmetrically with respect to a center axis 26 of the semiconductor component 1 in relation to the first column of the diodes. Likewise, the second control circuit 28 is arranged mirror-symmetrically with respect to the center axis 26 and the first control circuit 2. Likewise, apart from the third and fourth contact pads 13, 14, the contact pads of the second control circuit 28 are provided mirror-symmetrically with respect to the contact pads of the control circuit 2. The second control circuit 28 is configured like the first control circuit 2 to individually drive the individual diodes 3 connected to the second control circuit 28. Depending on the example chosen, the control circuit 2 and the second control circuit 28 may be configured identically. The fourth contact pad 14 of the control circuit 2 connects to the third contact pad 13 of the second control circuit 28 via an electrical line.

Figure 7:
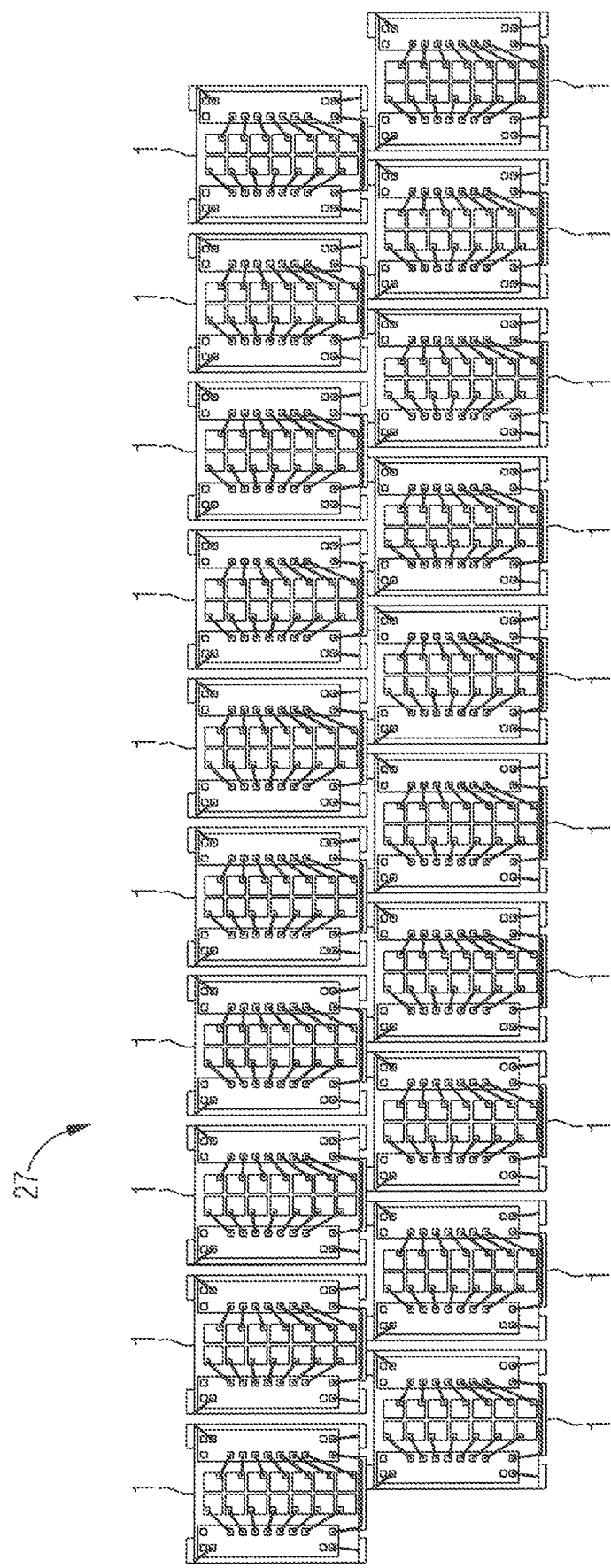
FIG. 7 shows a schematic illustration of a light source comprising a plurality of semiconductor components in accordance with FIG. 6.

FIG. 7 shows, in a schematic illustration, a light source 27 comprising twenty semiconductor components 1 configured in accordance with FIG. 6. The semiconductor components 1 are arranged in two columns, wherein ten semiconductor components 1 are arranged in each column. The semiconductor components 1 are arranged with the longitudinal extent perpendicular to the axis of the columns. The semiconductor components 1 of the two columns are arranged in a manner mutually offset with respect to one another such that a semiconductor component of a second column is arranged midway between two adjacent semiconductor components of the first column. A more uniform arrangement of the individual LEDs of the light source 27 is made possible as a result. A plurality of columns of semiconductor components comprising more or fewer semiconductor components per column may also be arranged, depending on the example chosen.

Figure 8:
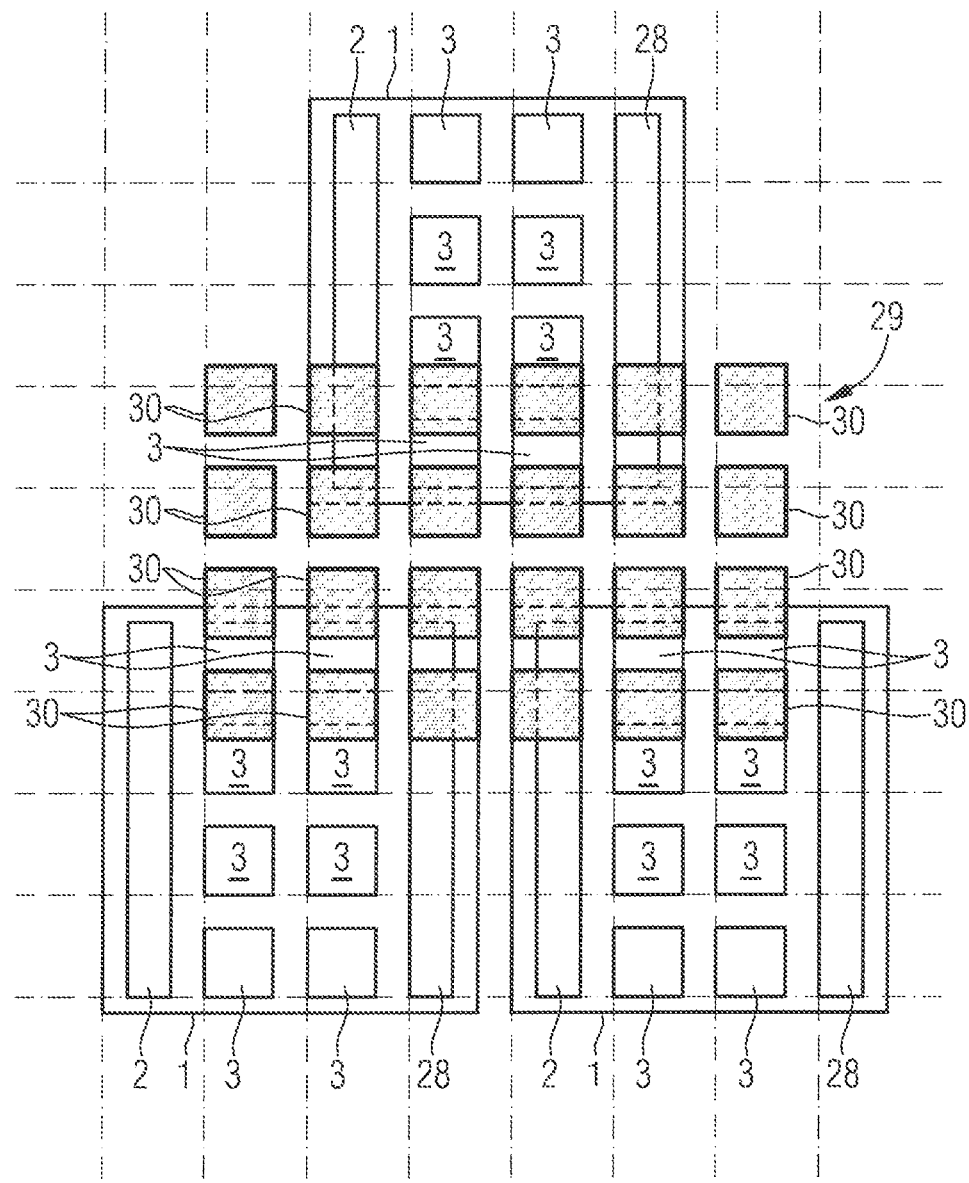
FIG. 8 shows a schematic illustration of the arrangement of three semiconductor components and an optical shift of the radiation of the light emitting diodes of the semiconductor components.

FIG. 8 shows, in a schematic illustration, three semiconductor components 1 constructed analogously to FIG. 6. In this case, only an excerpt from the light source 27 comprising three semiconductor components 1 is illustrated. An optical element 29 is illustrated schematically between the semiconductor components 1, the optical element homogenizing the light beams in an imaging plane. In this case, redistributed pixels 30 are illustrated in the imaging plane, the pixels being generated by the optical element 29 on the basis of the light beams of the individual diodes of the three semiconductor components illustrated. The light beams of the diodes 3 of the three semiconductor components 1 are thus imaged onto the 24 redistributed pixels 30.

Figure 9:
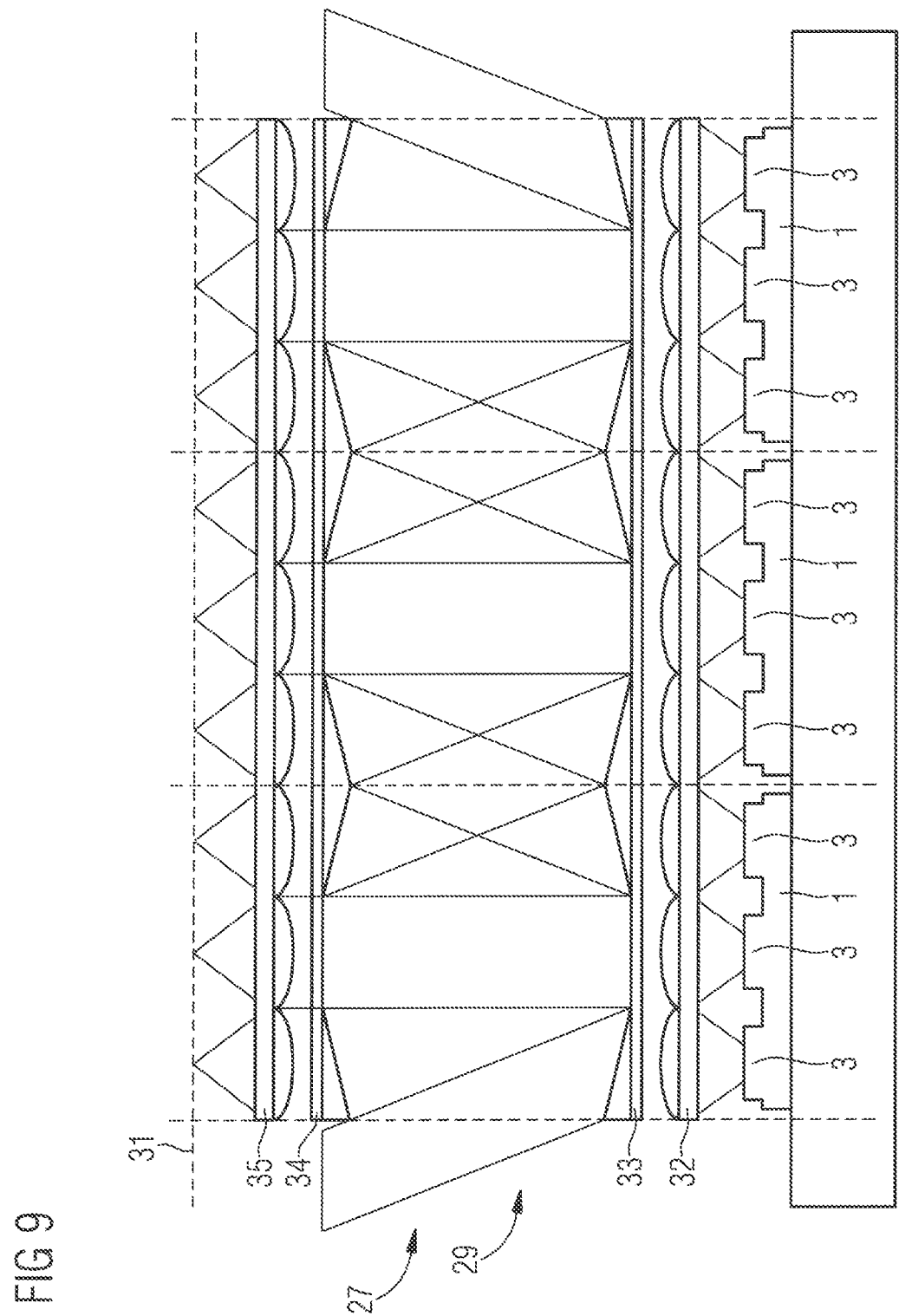
FIG. 9 shows a schematic sectional view of a light source comprising optical elements for imaging the light beams of a plurality of semiconductor components.

FIG. 9 shows, in a schematic sectional illustration, a light source 27 comprising a plurality of semiconductor components 1 each comprising a plurality of diodes 3. An optical element 29 generates a homogenous or continuous light area 31. An array of microlenses 32 followed by a prism array 33 is provided in the emission direction of the diodes 3. Furthermore, a further prism array 34 and a further microlens array 35 are arranged in the emission direction. These optical components form the optical element 29 that collimates and directs the light emitted by the diodes 3 of the semiconductor components 1. Alternatively or supplementarily, gratings, holographic elements, fresnel lenses and binary diffractive elements may also be used instead of microlenses and/or prisms. In the plane of the light area 31, a homogeneously illuminated, continuous light area is generated in this way. The continuous light area is not generated by a light mixing of the light beams of the individual diodes, but rather by an in particular seamless redistribution of the light beams of the individual diodes (pixels). Moreover, in the light area 31 each individual pixel may be driven individually by the driving of the corresponding pixel in the "Chip" array.

Figure 10:
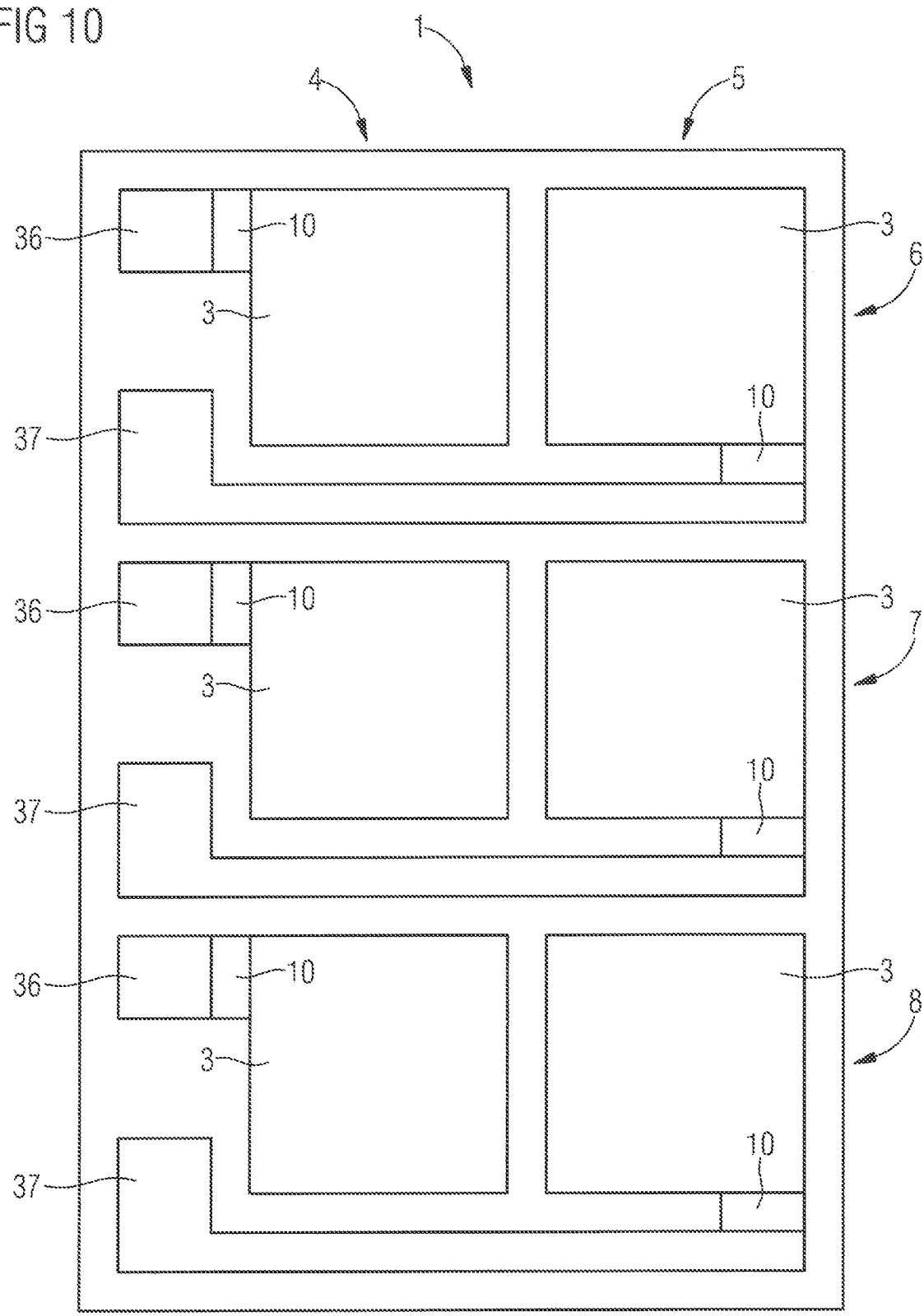
FIG. 10 shows a schematic illustration of a pixelated semiconductor chip comprising a plurality of individually drivable light emitting diodes.

FIG. 10 shows, in a schematic illustration, a partial excerpt from a first array 38 of a pixelated LED semiconductor chip, wherein the first array 38 comprises six diodes 3. The diodes 3 are arranged in two columns 4, 5 and three rows 6, 7, 8. The diodes of the first column 4 are electrically contacted in each case via a first contact track 36, wherein the contact tracks 36 are led laterally to the diodes 3. The first contact tracks 36 connect to a first electrical contact 10 of the diodes 3. The second electrical terminals of the diodes 3 connect to a ground potential via a rear side.

In addition, second contact tracks 37 are provided and electrically contact the diodes 3 of the second column 5. The second contact tracks 37 are led between two diodes of the first column 4 and two adjacent rows 6, 7, 8 to the diodes 3 of the second column 5. The second contact tracks 37 contact the diodes 3 of the second column 5 on a side facing an adjacent diode of the second column 5. A space-saving arrangement of the diodes and of the contact tracks 36, 37 on the semiconductor component 1 is made possible in this way.

Figure 11:
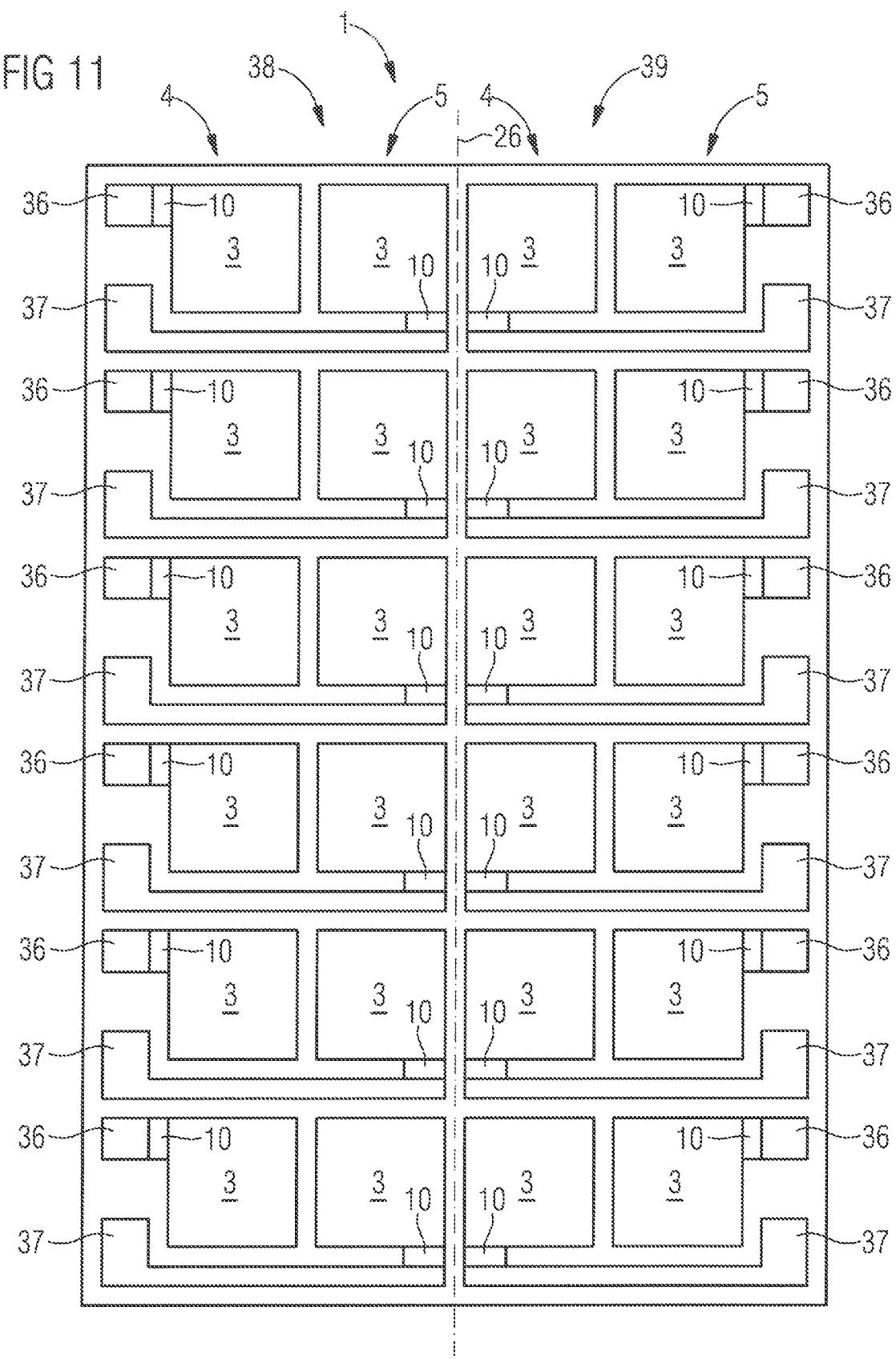
FIG. 11 shows a schematic illustration of a further arrangement of light emitting diodes on a semiconductor component.

FIG. 11 shows a further example of a semiconductor component 1, wherein a first array 38 of diodes 3 is provided. The first array 38 comprises two columns 4, 5 and six rows of diodes 3. The contacting of the diodes is embodied in a manner corresponding to the contacting in FIG. 10. Moreover, a second array 39 is provided, which is arranged mirror-symmetrically with respect to a center axis 26 and constructed like the first array 38. In the second array 39, too, two columns 4, 5 and six rows of diodes 3 are provided, which are contacted with contact tracks 36, 37 wherein the contact tracks 36, 37 are led laterally to the diodes 3 proceeding from a longitudinal side.

Figure 12:
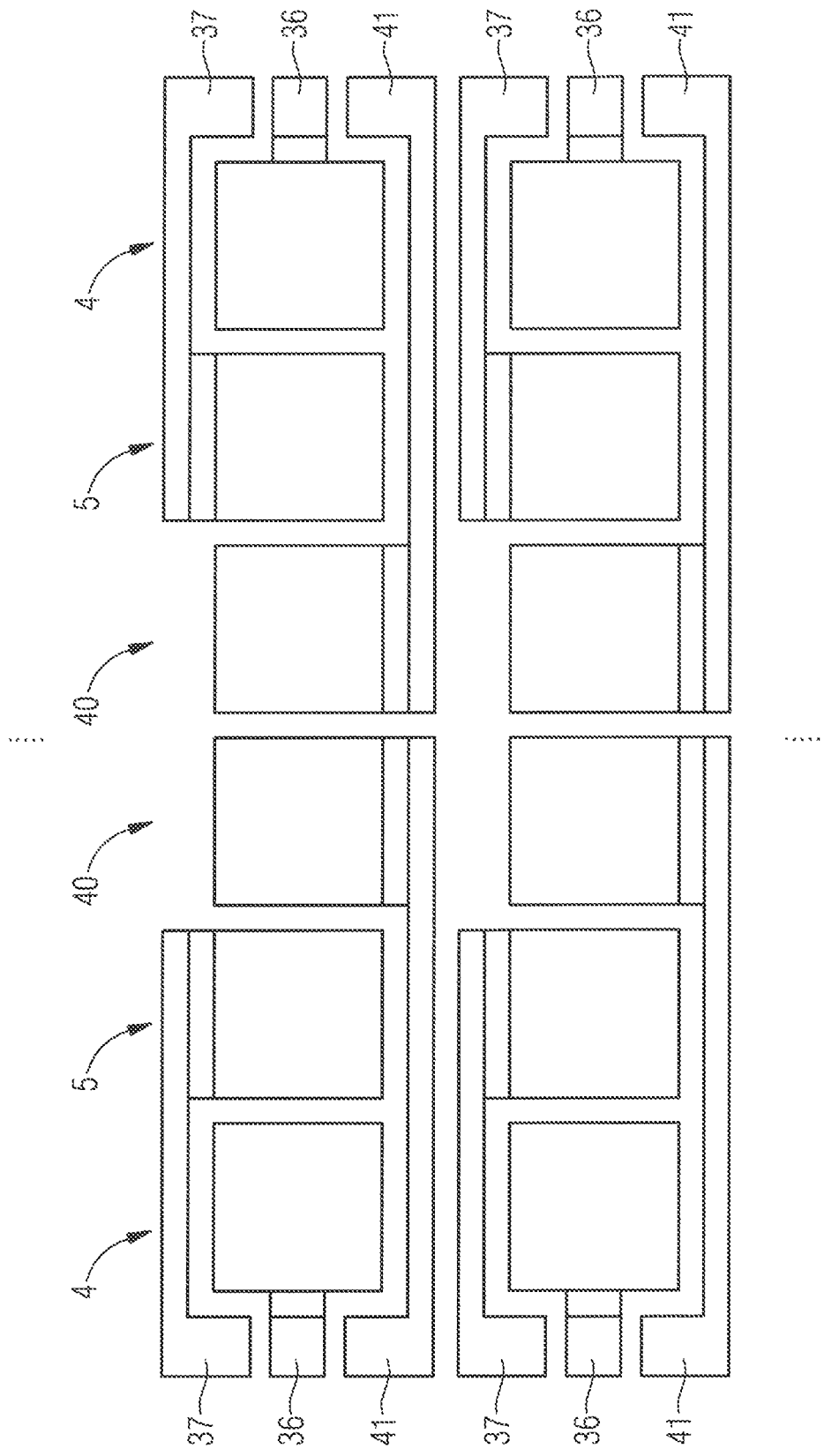
FIG. 12 shows an excerpt from a further arrangement of light emitting diodes with electrical contacting of the diodes.

FIG. 12 shows an excerpt from a semiconductor component 1 comprising a further arrangement of diodes 3. In this arrangement, three columns 4, 5, 40 of diodes 3 are provided. The diodes 3 of a row are electrically contacted via a first, a second and a third contact track 36, 37, 41. The diodes 3 of the third column 40 are contacted via the third contact track 41, which are likewise led between two rows of diodes to the corresponding diode 3 proceeding from a longitudinal side. Consequently, in each case a second and a third contact track 37, 41 are arranged between two rows of diodes. In this way, a compact arrangement of diodes 3 and contact tracks 36, 37, 41 is made available even for three columns and a plurality of rows.

Figure 13:
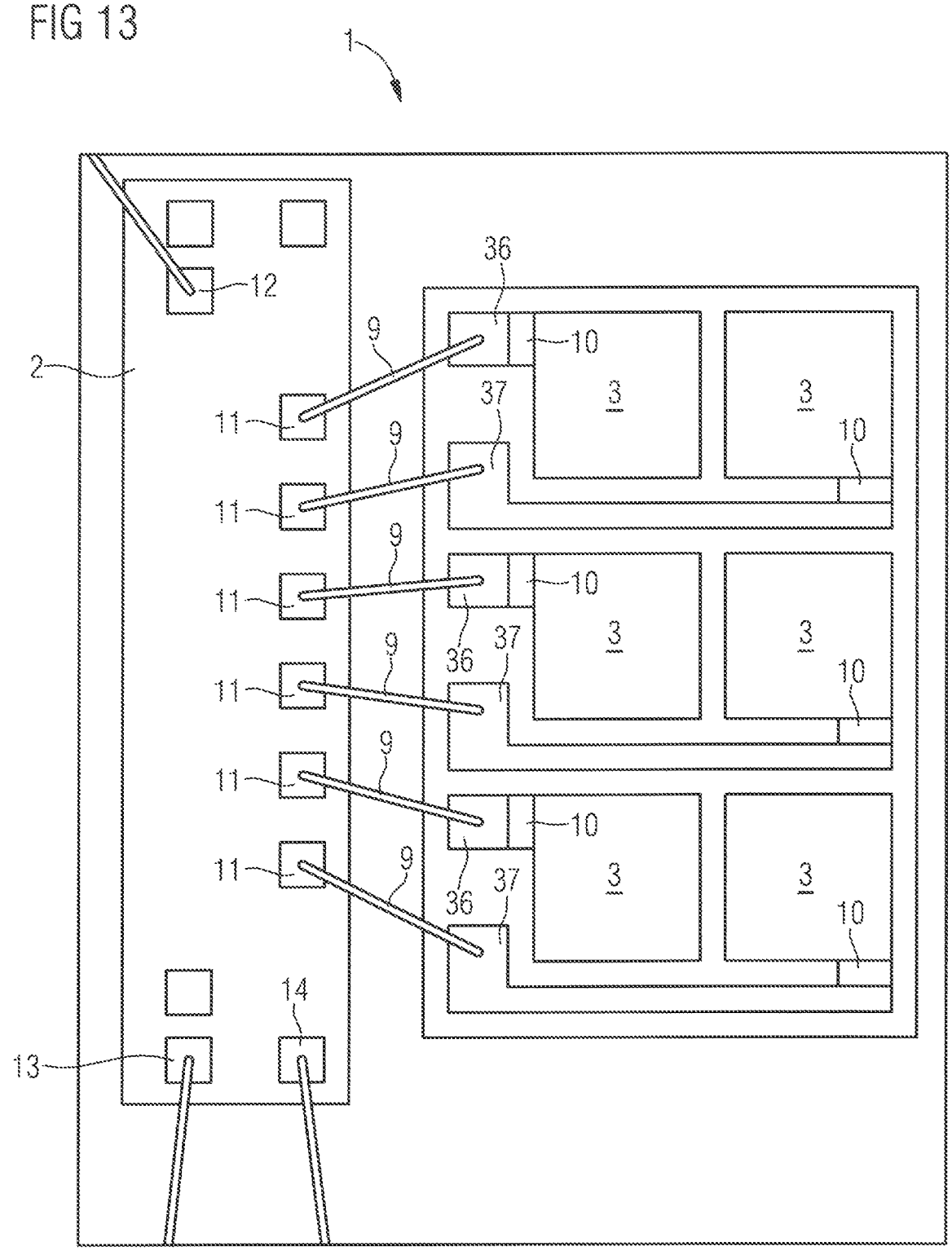
FIG. 13 shows a schematic plan view of a further example of a semiconductor chip.

FIG. 13 shows a view of a semiconductor component 1 comprising a first array 38 from FIG. 10, wherein a control circuit 2 is provided in addition to the diodes 3. The control circuit 2 comprises first contact pads 11 connected to the contact tracks 36, 37 via electrical lines 9, for example, bond wires. The contact tracks 36, 37 connect to first contacts 10 of the diodes 3. Moreover, the control circuit 2 comprises a second contact pad 12 to supply an electrical voltage, a third and fourth contact pad 13, 14 to feed a control signal and pass on a control signal. The control circuit 2 is substantially constructed in accordance with the example from FIG. 5.

Figure 14:
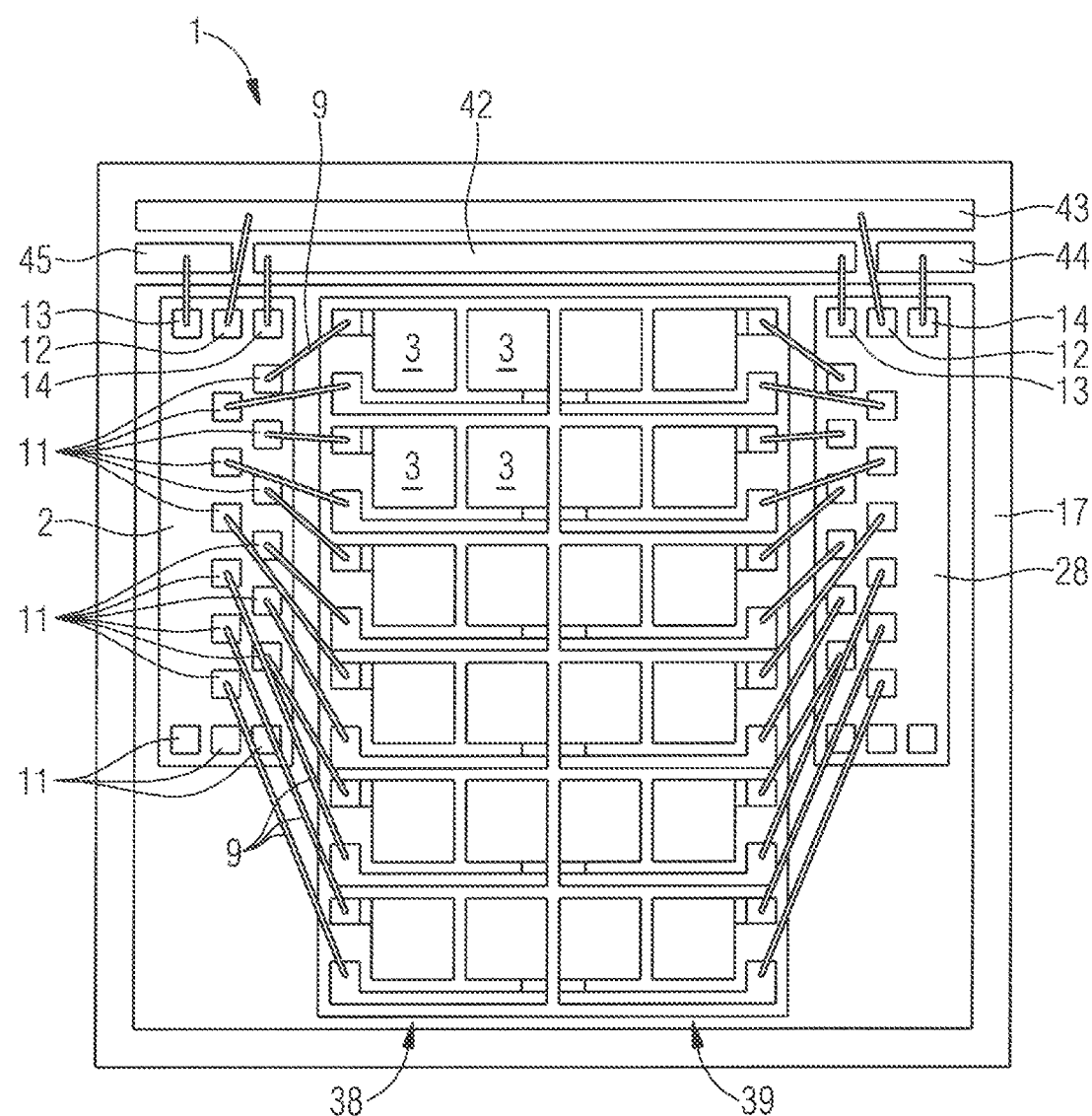
FIG. 14 shows a further example of a semiconductor component.

FIG. 14 shows a schematic illustration of a further semiconductor component 1 comprising light emitting diodes 3 in the arrangement in accordance with FIG. 11, wherein additionally in each case a control circuit 2, 28 is arranged on both sides of the arrays 38, 39. Furthermore, the carrier 17, on which the semiconductor component 1 is arranged, comprises a first, second, third and fourth electrical contact 42, 43, 44, 45. The first electrical contact 42 is configured in the form of an elongate strip and extends from the first control circuit 2 as far as the second control circuit 28. The first electrical contact 42 forwards the control signal received by the control circuit 2, is processed in the form of a daisy-chain protocol and passed on to the second control circuit 28. The second electrical contact 43 is likewise configured in the form of an elongate strip and supplies voltage both to the control circuit 2 and the second control circuit 28. The third and fourth electrical contacts 44, 45 feed and, respectively, pass on a control signal, for example, a control signal of a daisy-chain protocol.

Figure 15:
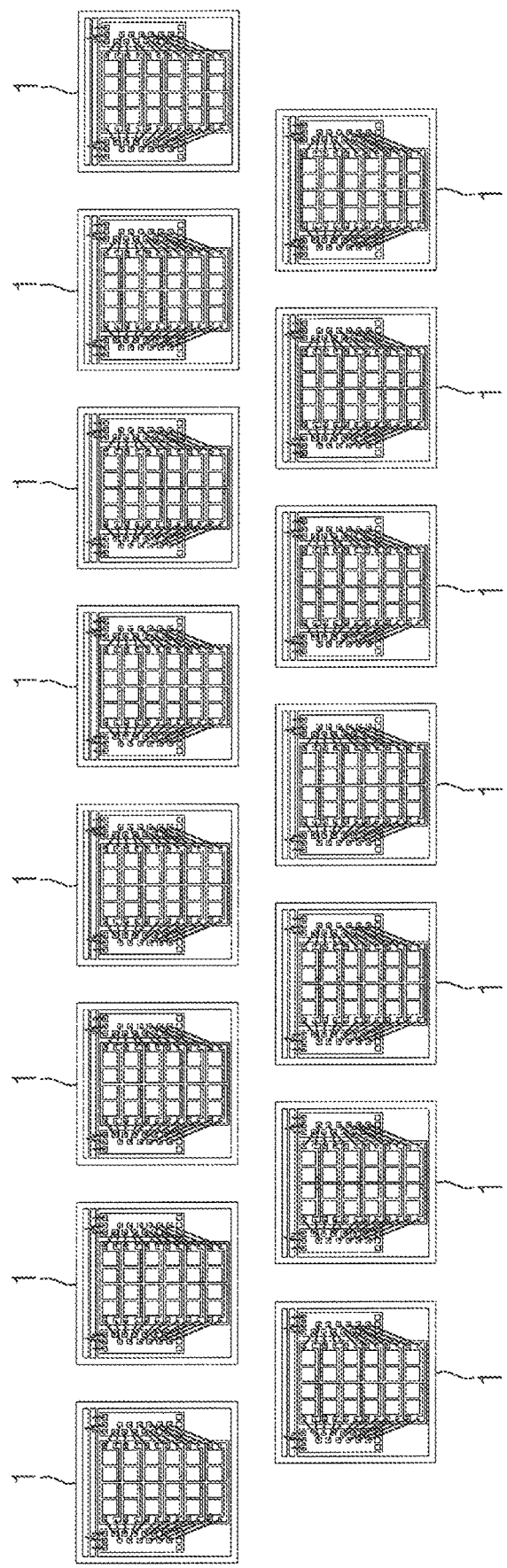
FIG. 15 shows a light source comprising a multiplicity of semiconductor components in accordance with FIG. 14.

FIG. 15 shows, in a schematic illustration, a light source 27 comprising two rows of semiconductor components 1, wherein each semiconductor component is constructed in accordance with FIG. 14. The semiconductor components 1 of the two rows are arranged such that a semiconductor component 1 of one row is arranged centrally in relation to two semiconductor components of the other row. A distribution of the light emitting diodes that is as uniform as possible is achieved in this way. To homogenously generate a light area, an optical element 29 is provided, as explained above. FIG. 15 illustrates only a partial excerpt from the light source 27. The light source 27 may comprise a multiplicity of columns and rows.

Although our light sources and semiconductor devices have been more specifically illustrated and described in detail by the preferred examples, nevertheless this disclosure is not restricted by the examples disclosed and other variations may be derived therefrom by those skilled in the art, without departing from the scope of protection of the appended claims.

This application claims priority of DE 10 2015 107 739.6, the subject matter of which is incorporated herein by reference.

The invention claimed is:

1. A light source comprising a plurality of individual and separate semiconductor components, wherein the semiconductor components are arranged in a grid of at least two columns and two rows, wherein a semiconductor component comprises a plurality of light-emitting diodes, and a separate and individual control circuit component that drives the diodes individually is arranged on the semiconductor component, the diodes are arranged in a predefined grid in at least two columns and at least two rows on the semiconductor component such that adjacent diodes along each column and along each row comprise the same spacing, and the plurality of individual and separate semiconductor components are arranged with spacings between the individual and separate semiconductor components along each column and along each row such that the diodes of adjacent individual and separate semiconductor components comprise the same spacing along each column and along each row as adjacent diodes along each column and along each row of a semiconductor component.

2. The light source according to claim 1, wherein each semiconductor component comprises four electrical contacts, a first contact is provided for ground, a second contact is provided for a voltage supply, a third contact is provided for a signal input and a fourth contact is provided for a signal output.

3. The light source according to claim 1, wherein on each semiconductor component the control circuit component which controls all diodes of the semiconductor component individually is arranged in an area between two columns of diodes of the semiconductor component.

4. The light source according to claim 1, wherein the two columns of diodes are arranged between the control circuit component and a further control circuit component.

5. The light source according to claim 1, wherein at least two columns of semiconductor components are provided, two adjacent semiconductor components of one column each comprise an identical spacing with respect to one another, the semiconductor components of the second column are arranged laterally offset with respect to the semiconductor components of the first column, and the semiconductor components of the second column are arranged about midway between two semiconductor components of the first column.

6. The light source according to claim 1, wherein two adjacent semiconductor components of one column each comprise an identical spacing with respect to one another, and wherein two adjacent semiconductor components of one row each comprise an identical spacing with respect to one another.

7. The light source according to claim 1, wherein a plurality of diodes are arranged in at least two columns and a plurality of rows, the diodes of a row are arranged on a straight line, the diodes of a column are arranged on a straight line, the diodes are arranged in a grid comprising spacings of identical magnitude between adjacent diodes, a first contact track for a first diode of the first row and the first column is led laterally to the diode, and a second contact track of a second diode of the second column and the first row is led laterally between two rows of diodes to the second diode.

8. The light source according to claim 7, wherein the diodes are arranged in at least three columns and a plurality of rows, a first contact track for a first diode of the first row and the first column is led laterally to the diode, a second contact track of a second diode of the second column and the first row is led laterally between two rows of diodes to the second diode, and a third contact track is led between two rows of diodes to the third diode of the third column and the first row.

9. The light source according to claim 7, wherein a first array of diodes comprising at least two columns and comprising a plurality of rows and comprising the contact tracks is provided, a second array comprising at least two columns and comprising a plurality of rows of diodes and the corresponding contact tracks is provided, the two arrays are configured and arranged mirror-symmetrically in relation to a mirror axis, and the mirror axis is arranged parallel to a column of the first array, such that the contact tracks are led laterally to the arrays in each case from outside.

10. The light source according to claim 1, wherein the control circuit components are arranged symmetrically with respect to a center axis of the semiconductor component, a third contact pad that feeds a signal and a fourth contact pad that passes on a signal are arranged mirror-symmetrically with respect to the center axis of the semiconductor component, and a first contact pad for a power supply of the at least one control circuit component is arranged mirror-symmetrically with respect to the center axis of the semiconductor component.

* * * * *